(12) United States Patent
Easton

(10) Patent No.: US 8,028,726 B2
(45) Date of Patent: Oct. 4, 2011

(54) AUTOMATIC VENTING OF REFILLABLE BULK LIQUID CANISTERS

(75) Inventor: Mark C Easton, New Paltz, NY (US)

(73) Assignee: International Business Machines Corporation, Armonk, NY (US)

(*) Notice: Subject to any disclaimer, the term of this patent is extended or adjusted under 35 U.S.C. 154(b) by 1337 days.

(21) Appl. No.: 11/566,845

(22) Filed: Dec. 5, 2006

(65) Prior Publication Data

US 2008/0128049 A1    Jun. 5, 2008

(51) Int. Cl.
*B67C 3/02* (2006.01)

(52) U.S. Cl. .............. 141/95; 141/4; 141/8; 141/83; 141/94; 141/192

(58) Field of Classification Search ........... 141/4–8, 141/59, 83, 94, 95, 100–105, 192, 198, 234, 141/237, 286, 302

See application file for complete search history.

(56) References Cited

U.S. PATENT DOCUMENTS

| | | | |
|---|---|---|---|
| 4,134,514 A | 1/1979 | Schumacher et al. | |
| 4,582,480 A | 4/1986 | Lynch et al. | |
| 4,622,988 A | 11/1986 | Takimoto et al. | |
| 5,964,254 A * | 10/1999 | Jackson | 141/21 |
| 6,435,229 B1 | 8/2002 | Noah et al. | |
| 6,637,475 B2 | 10/2003 | Noah et al. | |
| 6,955,198 B2 * | 10/2005 | Wodjenski | 141/248 |

* cited by examiner

*Primary Examiner* — Timothy L Maust

(74) *Attorney, Agent, or Firm* — DeLio & Peterson, LLC; Kelly M. Nowak; Katherine Brown

(57) ABSTRACT

Methods, systems and apparatus for automatically maintaining a pressure differential for the continuous delivery of a liquid to semiconductor manufacturing equipment. A refillable bulk liquid delivery system includes a plurality of canisters residing along a liquid flow path, whereby an over pressure is detected within at least one of the canisters. The over pressure may be detected using an automatic venting circuit or a programmable logic controller programmed for detecting such over pressures. The over pressure is then exhausted by removing excess pressure from the canister through a venting valve to maintain a Delta pressure across the canisters for continuously delivering the liquid along the liquid flow path.

14 Claims, 3 Drawing Sheets

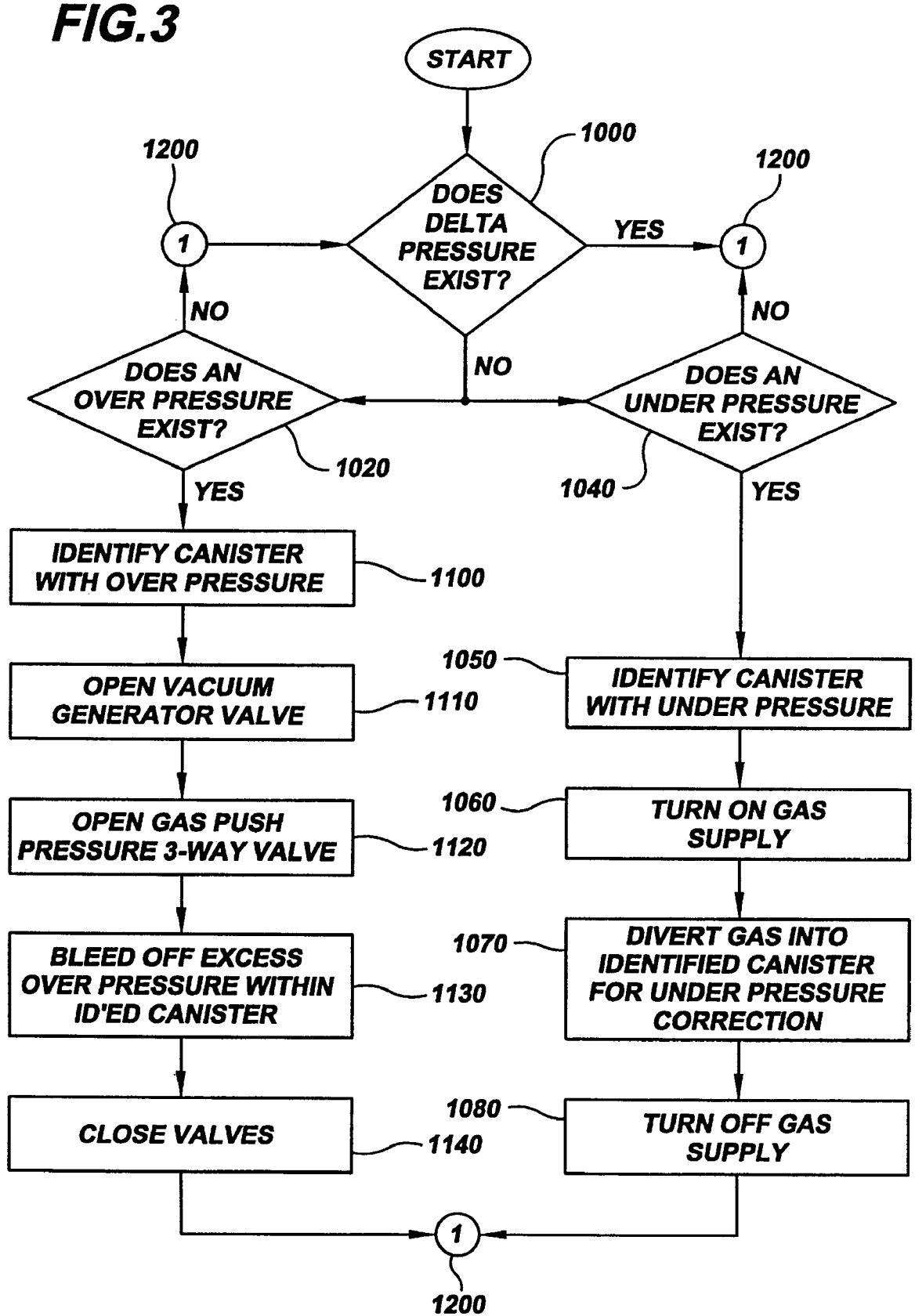

AUTOMATIC VENTING OF REFILLABLE BULK LIQUID CANISTERS

BACKGROUND OF THE INVENTION

1. Field of the Invention

The present invention is directed to refillable bulk liquid canisters, and in particular, to methods, systems and apparatus for automatically controlling and maintaining a pressure differential between supply canisters and receiving canisters within a bulk delivery assembly for continuous delivery of a liquid chemical to manufacturing process tools 2. Description of Related Art In the manufacture of semiconductor devices, chemical vapor deposition (CVD) techniques are often used to deposit various layers onto a substrate. The liquid chemicals (hereinafter "liquid") used by the CVD tools are received at the CVD processing tools via bulk feeding from a remote bulk delivery cabinet. Various remote delivery cabinets exist in the art including, for example, those that bubble a liquid from a canister to the processing tools, or those that push a liquid along a path running from a refillable bulk supply source to a process canister and out to the processing tools. Since liquid bubbling cabinets are limited to the amount of liquid residing with the bubbled canister, these systems are generally not as extendable to the various processing techniques in the art as compared to those systems having a supply source of liquid for continued supply.

Refillable bulk liquid delivery cabinets include a bulk canister in combination with a process canister. The bulk canister retains the liquid (e.g., liquid precursors, such as, TEOS), and when it is determined that the liquid within the process canister falls below a preset level, the bulk canister delivers and refills the process canister with enough liquid to satisfy the preset level. The process canister pushes this liquid to the manufacturing equipment (e.g., the CVD tool). A delivery system that includes the bulk and process canisters alone is generally beneficial when the manufacturing equipment consumes small quantities of liquid chemicals, such as, for example, thin film depositions.

However, when the manufacturing equipment consumes large quantities of liquid chemicals, it is often necessary that the liquid chemical delivery equipment also include bulk canisters that can supply this demand. One approach in the prior art is to replace the bulk canister while the process canister continues to run. In so doing, the bulk canister is taken offline while the process canister continues to supply the chemical. This approach is undesirable since the liquid in the process canister can quickly deplete while the bulk canister is off-line, leading to manufacturing interruptions, which in turn, often result in time delays, decreased production yields and increased costs.

Another approach for providing large quantities of liquids is to provide the bulk delivery system with a large central supply canister that can supply multiple bulk canisters located at source cabinets for the production equipment. Such a configuration may include a 200 Liter central supply canister within a secondary cabinet that fills the bulk canister(s) at the source cabinets. The use of a larger central supply canister eliminates the need to take production equipment off line, thereby reducing the number of container changes, labor, and shipping costs.

In order for bulk delivery systems having a large central supply canister(s) to work properly, it is necessary that the pressures within the central supply canister, each bulk canister and each process canister be continuously maintained for continued flow of the liquid to the processing tools. The flow path is ideally a hierarchial flow path output from the central supply canister, to the bulk canister(s), to the process canister(s), and then out to the processing equipment. Along this flow path, a Delta pressure must be maintained such that the central supply canister has a higher pressure than the bulk canister(s) it supplies liquid to, and in turn, the bulk canister(s) has a higher pressure than the process canister(s) to which it supplies such liquid for proper functioning of the bulk delivery system.

Currently, pressures within such bulk delivery systems are regulated through the use of manually preset pressure regulators, which are programmed to a desired set point delivery pressure. Each canister within the system may be provided with one of these manually preset pressure regulators. However, manually preset pressure regulators only determine if the pressure within a given canister falls below (or under) the programmed set point, and if so, the pressure within such canister is increased through the use of a pneumatic valve for adding Helium to the canister. These manually preset pressure regulators do not take into account over pressures within the canisters of the bulk delivery system.

Another deficiency of the manually preset pressure regulators is that they have a five percent fluctuation range from the preset desired set point delivery pressure. This means that the pressure for a given canister can undesirably drift five percent above or below its desired pressure set point. A five percent drift below the desired pressure set point may slow the liquid flow path, which can undesirably slow production and decrease production yields. Similarly, a five percent drift above the desired pressure set point may increase the liquid flow path to undesirably result in a thicker than desired layer deposition, which may also decrease production yields. The five percent pressure fluctuation of these manually preset pressure regulators may further interfere with the Delta pressure between the large supply canister, supply canister(s) and process canister(s), causing a potential equilibrium therebetween, such that, the liquid flow stops within the delivery system (i.e., the liquid is not pushed along the flow path), thereby also slowing production and decreasing production yields.

While prior art is directed to pressure and flow regulators on the output of the regulator to control the flow of push gas pressure into other source canisters based on under pressure conditions, the prior art does not take into account over pressure conditions as a result of the pressure of the liquid being supplied or any variations from the regulator settings. Currently, to recover from a pressure imbalance due to over pressure conditions, an operator must wait for such an event to occur, and then manually vent off the helium supply pressure to regulate the pressure back down to the desired set point delivery pressure.

Accordingly, there is a need in the art for methods, systems and apparatus that automatically take into account both under and over pressure imbalances within a liquid bulk delivery system for the uninterrupted stream of liquid chemicals to multiple process tools.

SUMMARY OF THE INVENTION

Bearing in mind the problems and deficiencies of the prior art, it is therefore an object of the present invention to provide methods, systems and apparatus that automatically control and maintain a pressure differential between canisters within a refillable liquid bulk delivery system for the continuous, uninterrupted delivery of chemicals to manufacturing process tools.

Another object of the present invention is to provide methods, systems and apparatus for refillable liquid bulk delivery systems that significantly minimize the need to take canisters off-line, thereby reducing the number of container changes.

It is another object of the present invention to provide methods, systems and apparatus that automatically take into account both under and over pressure imbalances within a refillable liquid bulk delivery system.

Other objects of the present invention is to provide methods, systems and apparatus for the continuous, uninterrupted delivery of chemicals to manufacturing process tools via refillable liquid bulk delivery systems that substantially minimize manufacturing interruptions to improve production yields, lead times and costs.

Still objects of the present invention are to provide methods, systems and apparatus for refillable liquid bulk delivery systems that maintain and control a Delta pressure along the flow path of canisters within the system.

Another object of the present invention is to provide methods, systems and apparatus for refillable liquid bulk delivery systems that significantly minimize any pressure fluctuations from ideal pressure set points.

Other objects and advantages of the invention will in part be obvious and will in part be apparent from the specification.

The above and other objects, which will be apparent to those skilled in art) are achieved in the present invention, which is directed to, in a first aspect, a method for automatically maintaining a pressure differential for the continuous delivery of a liquid to semiconductor manufacturing equipment. The method includes providing a refillable bulk liquid delivery system having a plurality of canisters residing along a liquid flow path. An over pressure within at least one of the canisters is detected. This over pressure is then exhausted by removing excess pressure from the canister to maintain a Delta pressure across the canisters for continuously delivering the liquid along the liquid flow path.

in this aspect of the invention, the refillable bulk delivery system includes a central supply canister supplying the liquid to at least one bulk supply canister, which in turn, supplies the liquid to at least one process canister. An automatic venting circuit may be in communication with the canister having the over pressure. This automatic venting circuit detects such over pressure for the exhausting thereof to maintain the Delta pressure. The system may also include a canister pressure monitor for simultaneously monitoring under pressure conditions along with the over pressure for maintaining the Delta pressure.

Preferably, each of the central supply canister, the bulk supply canister and the process canister has an automatic venting circuit in communication therewith. In this manner, the automatic venting circuits may simultaneously monitor and regulate over pressure conditions within the various canisters to which they are connected for maintaining the Delta pressure.

Each automatic venting circuit is positioned on a gas source inlet side of its corresponding canister, and at least comprises a switch gauge, a vacuum relay and a time delay relay. In maintaining the pressure differential, the method may further include activating the switch gauge upon detection of the over pressure. The activated switch gauge activates both the vacuum relay and the time delay relay. The vacuum relay opens a vacuum, while the time delay relay opens a gas source to a venting position. The venting position is in communication with an exhaust. Excess pressure is retrieved from the canister having the over pressure using the vacuum. This excess pressure is removed through the gas source venting valve to the exhaust for regulating the pressure within the canister back to a desired pressure that maintains the Delta pressure.

As an alternative approach, a programmable logic controller may be used to detect the over pressure and exhaust such over pressure for maintaining the Delta pressure. In this aspect, it is first determined if the Delta pressure is maintained across the plurality of canisters. If an imbalance is detected within the Delta pressure, it is then determined if an over pressure exists within at least one of the canisters.

If an over pressure is detected, the canister having such over pressure is identified, and then both a vacuum connected to the canister is opened along with opening a gas source valve to a venting position. The gas venting valve connects the canister to an exhaust. Excess pressure is then retrieved from the canister using the vacuum. This excess pressure is removed through the gas source venting valve to the exhaust for regulating the pressure within the canister back to a desired pressure that maintains a Delta pressure.

The method may further include determining if an under pressure exists within the system, and if so, providing additional gas to the canister having such under pressure. The control of under pressures and over pressures may be performed simultaneously within the system in order to maintain the required Delta pressure for continuously supplying a liquid to the manufacturing equipment.

The invention also includes systems and program storage devices capable of carrying out the method steps described herein

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 shows a flow chart of a process of the invention for maintaining a Delta pressure across canisters of a refillable bulk delivery system.

DESCRIPTION OF THE PREFERRED EMBODIMENT(S)

In describing the preferred embodiment of the present invention, reference will be made herein to FIGS. 1-3 of the drawings in which like numerals refer to like features of the invention.

The present invention is directed to the pressure control of refillable bulk and process liquid canisters where one liquid canister refills another by using a push gas pressure, a dip tube built into the canister, and plumbing connecting the canisters. The bulk canister can only refill the process canister so long as there is a Delta pressure differential where the receiving canister pressure is lower than the supplying canister pressure. The purpose of this invention is to maintain this Delta pressure differential between the supply and receiving canisters, while the chemical in the receiving canister is being consumed by processing tools or equipment.

In more detail, current methods of liquid delivery do not take into account pressure imbalances that exceed set points of delivery pressures. These over pressures within a canister may occur due to the pressures of the liquid being supplied to such canister. Over pressure conditions undesirably leave the canisters in a state of pressure equalization or a state where the receiving canister has a greater pressure than the supplying canister. The result is that only one canister is in operation, and over time, the liquid chemical in this operating canister will deplete, stopping the production equipment. This invention automatically controls and maintains a Delta pressure between canisters within a refillable liquid delivery system by automatically monitoring and regulating under pressure conditions, as well as over pressure conditions within the system for the uninterrupted stream of liquid chemicals to multiple process tools.

Figure 1:
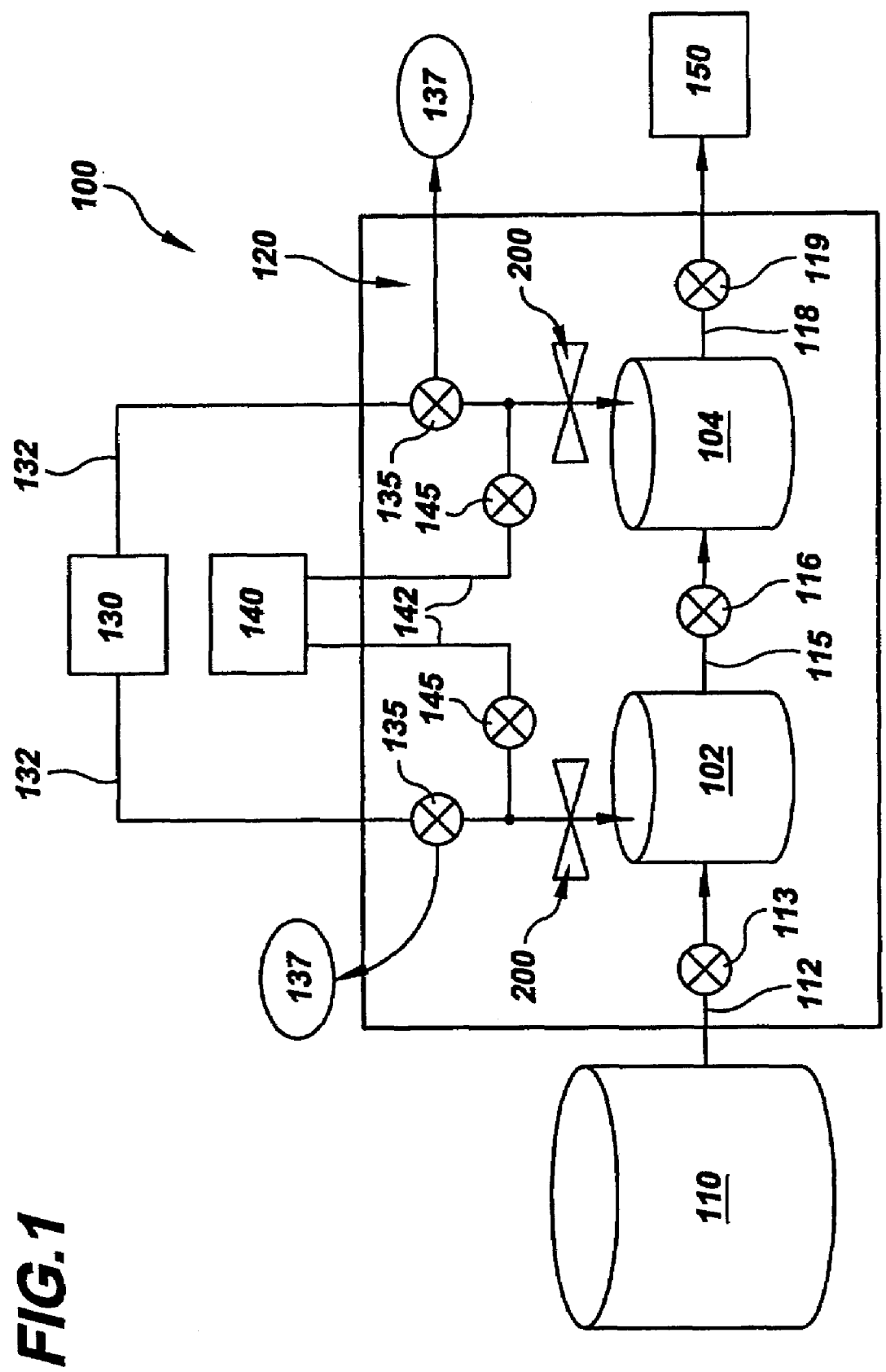
FIG. 1 shows a refillable bulk delivery system with at least one automatic venting circuit for monitoring and regulates over pressures within the canisters of the bulk delivery system.
Figure 2A:
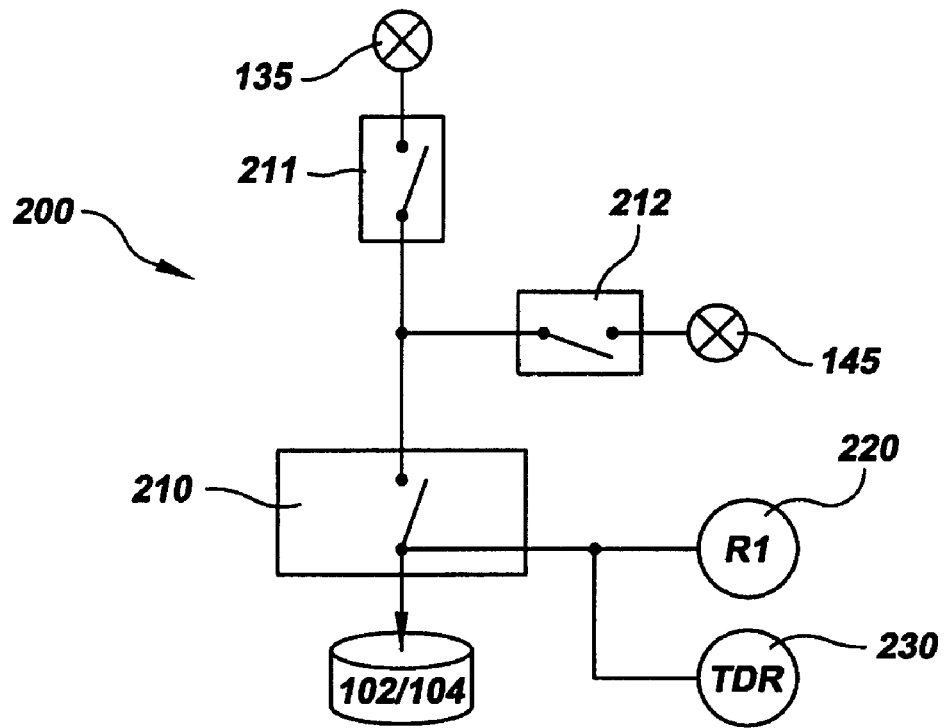
FIGS. 2A and 2B respectively show the automatic venting circuit in the non-operating mode and in the operating mode.
Figure 2B:
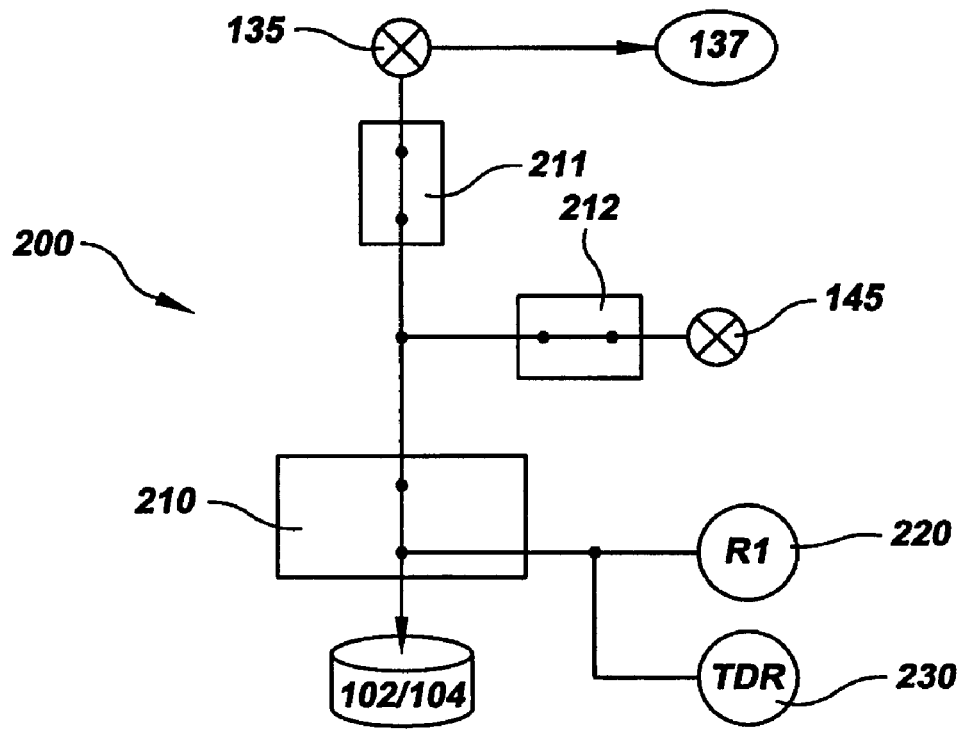

FIGS. 1 and 2A-B show one embodiment of the invention for maintaining a Delta pressure within the refillable bulk delivery system 100. A large central supply canister 110 can be connected to a single source cabinet 120, or alternatively, multiple source cabinets (not shown). For instance, the large central supply canister 110 may comprise a 200 Liter central supply canister.

Each source cabinet 120 includes at least one bulk supply canister 102 and one processing canister 104. Pipe 112 feeds a liquid chemical (i.e., liquid) into the bulk supply canister 102 and has an on/off valve 113 for regulating the flow of liquid into such canister. Once the liquid is within the bulk supply canister 102, a pipe 115, with on/off valve 116, delivers the liquid from the bulk supply to the processing canister 104. Pipe 118, with on/off valve 119, delivers the liquid from the processing canister 104 out to manufacturing or processing tools 150. It should be appreciated and understood that with all on/off valves 113, 116, 119 open, the liquid is allowed to flow continuously through the system and out to the processing tools. However, any of these on/off valves may be closed for stopping the liquid flow between the corresponding canisters.

Again, in order for the liquid to flow continuously through this bulk delivery system 100, the on/off valves are in the open position, and a Delta pressure must be maintained across the canisters. In so doing, the pressure within the central supply canister 110 must be higher than the pressure in the bulk supply canister 102, which in turn, is higher than the pressure in the processing canister 104.

The refillable bulk delivery system 100 also includes a gas source 130, typically helium gas, for providing gas into canisters 102, 104 via pipe 132, which also has a gas three-way valve 135. In accordance with the invention, the gas three-way valve preferably includes a valve used to divert gas into canisters 102 and/or 104, a valve used to vent gas from canisters 102 and/or 104 to an exhaust 137, and a bypass valve. The valve 135 may also include a valve to divert gas to an outlet weldment, which may be used to bleed the gas source pipes either prior to use or periodically during utilization of the present system. A vacuum generator 140, having a vacuum generator valve 145, is used to control and regulate over pressures within the canisters.

In maintaining the Delta pressure across the canisters, the first embodiment of the invention uses an automatic venting circuit 200. As shown in FIG. 2, the automatic venting circuit 200 of the invention at least includes a switch gauge 210, a vacuum generator relay 220, and a time delay relay 230 for the gas three-way valve. The relays may be installed within an electrical enclosure on each canister. The automatic venting circuit also includes a first pneumatic valve 211 in electrical communication with the gas three-way valve 135 and a second pneumatic valve 212 in electrical communication with the vacuum generator valve 145. These pneumatic valves can tie into existing electrical lines within the delivery system.

The automatic venting circuit 200 is preferably positioned on the gas inlet side of each liquid canister. The switch gauge 210 may be set in the same location as the existing canister pressure monitoring hardware, which is set to monitor under pressure conditions. Each canister within the bulk delivery system 100 may be provided with the automatic venting circuit 200 of the invention. This includes the large central supply canister 110, which may also be connected to gas source 130 via a pipe having an on/off switch and to the vacuum 140 via piping having an on/off switch (not shown). Each switch gauge 210 is set to a desired delivery pressure of the corresponding canister to which it is connected.

In accordance with the invention, the automatic venting circuit 200 monitors and regulates over pressure conditions within the bulk delivery system 100. Referring to FIG. 2A, during normal operating conditions a Delta pressure exists across the canisters for the continuous flow of liquid through the delivery system to processing tools, and the switch gauge 210 of the automatic venting circuit 200 remains open. However, in the event of an over pressure within a given canister, the automatic venting circuit 200 detects such over pressure condition. That is, the pressure within the canister has gone above its desired set delivery pressure.

Referring to FIG. 2B, upon a switch gauge 210 detecting an over pressure within its corresponding canister, the switch gauge is activated by closing its contacts. Once activated, the switch gauge 210 sends a signal to activate the vacuum generator relay 220. The vacuum generator relay sends another signal to close the contact within the second pneumatic valve 212 for opening the vacuum generator valve 145. This opens the vacuum generator 140 such that it is in communication with the gas push pressure three-way valve 135.

The signal of the activated switch gauge 210 also activates a gas push pressure time delay relay 230. This relay 230 sends a signal to close the contact within the first pneumatic valve 211 for opening the gas push pressure three-way valve 135 to the vent position. The vacuum generator pulls the excess over pressure from the canister through the piping out to the gas push pressure three-way valve 135 which is in the venting position. The vent position of the three-way valve connects the system to exhaust 137 for venting off this excess pressure within the canister.

The gas push pressure three-way valve may remain in the venting position for a period set by the time delay relay 230, or alternatively, until the switch gauge 210 pressure set point has been satisfied, indicating that the pressure within the canister has been reduced back to the ideal pressure within the canister. For instance, the time delay relay may be activated for 2-5 seconds. In so doing, the instant switch gauge 210 bleeds off any excess pressure within the canisters having an over pressure condition. Once the over pressure within a given canister has been stabilized, the automatic venting circuit 200 becomes inactive by opening the contacts within the switch gauge 210 and the pneumatic valve 211, 212.

Again, it should be appreciated and understood that each canister within a refillable bulk delivery system may be provided with the present automatic venting circuit 200 at the gas push pressure inlet lines. As such, any one of the automatic venting circuits 200 on any one of the gas inlet lines leading to its corresponding canister may detect an over pressure condition within its corresponding canister.

In accordance with the invention, the bulk delivery system may be equipped with both the instant automatic venting circuit 200 for venting over pressures, in combination with existing canister pressure monitoring hardware for regulating under pressure conditions by supplying additional gas to the canister having an under pressure. In so doing, the bulk delivery system is able to simultaneously control and regulate over pressures alone, under pressures alone, or even the combination of over pressures and under pressures across the various canisters within the bulk delivery system for maintaining a continuous, uninterrupted flow of liquid to manufacturing and processing tools. For instance, one or more canisters may have over pressure conditions that may be regulated by its corresponding automatic venting circuit 200, either simultaneously or sequentially, while other canisters experience under pressure conditions that are also simultaneously or sequentially regulated by existing hardware.

In another aspect of the invention, rather than using the automatic venting circuit 200 of the invention to monitor and regulate over pressures within corresponding canisters, over pressures may be monitored and controlled through the use of programmable logic controller. Like that of the instant automatic venting circuit, this programmable logic controller is programmed to automatically control and maintain a Delta pressure across canisters within a refillable liquid delivery system. The logic automatically monitors and regulates both under pressures and over pressures within the system for the uninterrupted stream of chemicals to manufacturing equipment or tools.

A flow chart of the process used in the present invention is shown in FIG. 3. Numerals in circles indicate connections to and from other parts of the flow chart. FIG. 3 illustrates the method steps of the present invention of monitoring and regulating over pressure conditions, along with under pressure conditions, within a bulk delivery system for the continuous, uninterrupted of fluid flow through the system out to processing equipment. It should be appreciated and understood that FIG. 3 shows one embodiment of the process flow of the invention, and that several variations thereof may exist for maintaining a Delta pressure across canisters within a refillable bulk delivery system.

The flow chart description of FIG. 3 is as follows:

Step 1000. The process is started and then logic determines if a Delta pressure exists across the canisters within a refillable bulk delivery system. The programmable logic controller is in communication with all canisters of the bulk delivery system. That is, the large central supply canister 110 must be at a higher pressure than the bulk supply canisters 102 to which it supplies liquid, which in turn, must be at a higher pressure than the processing canisters 104 to which it supplies liquid. If a Delta pressure exists, then the process flow continues to step 1200. If a Delta pressure does not exist, then the process flow continues to step 1020.

Step 1200. At this step, the process flow repeats back to step 1000 for continuously determining if a Delta pressure exists within the bulk delivery system. This step enables the continuous monitoring and regulating of the canister pressures across the system to ensure a continuous flow of liquid out to processing tools.

Step 1020. If it has been determined that a Delta pressure does not exist, then the logic determines if an over pressure exists in any of the canisters of the bulk delivery system. If it is determined that an over pressure exists, then the process flow continues to step 1100. However, if an over pressure does not exist, then the process continues to step 1040.

Step 1040. The programmable logic also determines if an under pressure exists within any of the canisters of the bulk delivery system. It should be appreciated that this step may be performed before or after step 1020, or it may even be performed simultaneously with step 1020. If an under pressure does not exist, then the process flow repeats back to step 1200 to form the continuous loop of the present pressure monitoring and regulating process. However, if an under pressure does exist, then the process flow continues to step 1050.

Step 1050. The logic identifies the canister of the bulk delivery system having the under pressure. The process flow continues to step 1060.

Step 1060. The gas push pressure three-way valve 135 is turned to the on position for opening a line between the gas source 130 and the canister in need of regulation. The process flow continues to step 1070.

Step 1070. Gas is pushed from the gas source 130 into the canister having the under pressure condition. This occurs for a time sufficient to supply enough gas into such canister for correcting the under pressure condition and regulating the canister pressure up to its idea pressure. The process flow continues to step 1080.

Step 1080. The gas three-way valve used to divert gas into the canister is closed, such that, the gas three-way valve is set back to the bypass position (i.e., closed position). The process continues back to step 1200 for continuously monitoring and maintaining a Delta pressure across the canisters within the bulk delivery system.

Step 1100. From step 1020, if it is determined that an over pressure exists within a canister of the bulk delivery system, then the logic identifies this canister with the over pressure. The process flow continues to step 1110.

Step 1110. The programmable logic controller activates the vacuum generator three-way valve 145 to open the vacuum generator valve 145. This opens the vacuum generator 140 such that it is in communication with the gas push pressure three-way valve 135. The process flow continues to step 1120.

Step 1120. The programmable logic controller opens the gas push pressure three-way valve 135 to the venting position for connection to exhaust 137. The process flow continues to step 1130.

Step 1130. With the vacuum open to canister having an over pressure and the venting exhaust, the vacuum then pulls the excess over pressure from the canister through the piping and gas push pressure three-way vent valve, out to the exhaust 137 for removing any excess pressure within the canister. This step continues for a sufficient time until the logic determines that the pressure within the canister has been regulated back down to its ideal working condition for maintaining the Delta pressure across the canisters within the delivery system. The process flow continues to step 1140.

Step 1140. Once the over pressure within the canister having such over pressure has been regulated back down to its ideal pressures the vacuum generator three-way valve 145 is closed along with closing the gas push pressure three-way valve 135 to the bypass position. This will stop the bleeding process and return the bulk delivery system to normal operating conditions running with a Delta pressure. The process flow repeats back to step 1200 for the automatic, continuous monitoring and regulation of over pressures within all canisters of the bulk delivery system.

It should be appreciated that components of the present invention may be embodied as a computer program product stored on a program storage device. These program storage devices may be devised, made and used as a component of a machine that utilizes optics, magnetic properties and/or electronics to perform certain of the method steps of the present invention. Such program storage devices may include, but are not limited to, magnetic media such as diskettes or computer hard drives, magnetic tapes, optical disks, Read Only Memory (ROM), floppy disks, semiconductor chips and the like A computer readable program code means in known source code may be employed to convert certain of the method steps described below. This computer readable program code contains instructions embodied in tangible media, such as floppy disks, CD-ROMS, hard drives, or any other computer-readable storage medium, wherein, when the computer program code is loaded into and executed by a computer, the computer becomes an apparatus for practicing the invention.

While the present invention has been particularly described, in conjunction with a specific preferred embodiment, it is evident that many alternatives, modifications and variations will be apparent to those skilled in the art in light of the foregoing description. It is therefore contemplated that the appended claims wilt embrace any such alternatives) modifications and variations as falling within the true scope and spirit of the present invention.

Thus, having described the invention, what is claimed is:

1. A system for delivering chemicals in a semiconductor manufacture process comprising:
   a central supply canister supplying a liquid to a bulk supply canister;
   a process canister receiving said liquid from said bulk supply canister;
   a Delta pressure whereby said central supply canister has a higher pressure than said bulk supply canister, which in turn, has a higher pressure than said process canister;
   automatic venting circuits on gas inlet lines of a gas source leading into each of said central supply canister, said bulk supply canister and said process canister, each said automatic venting circuit continuously detecting any over pressure conditions within its respective canister and exhausting said over pressure for maintaining said Delta pressure.

2. The system of claim 1 wherein said automatic venting circuit comprises:
   a switch gauge for detecting said over pressure and opening a gas source valve to a venting position;
   a vacuum relay for opening a vacuum to said respective canister having said over pressure;
   a time delay relay for allowing said vacuum to suction excess pressure from said respective canister through said gas source venting valve out to an exhaust until a desired canister pressure has been obtained that maintains said Delta pressure.

3. The system of claim 2 further including a first pneumatic valve for opening a vacuum generator valve to open said vacuum and a second pneumatic valve for opening said gas source valve to said venting position.

4. The system of claim 1 further including a canister pressure monitor for simultaneously monitoring and regulating both under pressure conditions and over pressure conditions for maintaining said Delta pressure.

5. The system of claim 1 further including a programmable logic controller as a backup for detecting said over pressure conditions.

6. A method for automatically maintaining a pressure differential for the continuous delivery of a liquid to semiconductor manufacturing equipment comprising:
   providing a refillable bulk liquid delivery system having a plurality of canisters residing along a liquid flow path, said refillable bulk delivery system includes a central supply canister supplying said liquid to at least one bulk supply canister, which in turn, supplies said liquid to at least one process canister, said central supply canister, said bulk supply canister and said process canister each having an automatic venting circuit in communication therewith, selected ones of said automatic venting circuits simultaneously detect over pressure conditions within corresponding canisters for simultaneously controlling over pressure conditions within various canisters for maintaining said Delta pressure;
   detecting an over pressure within at least one of said canisters; and
   exhausting said over pressure by removing excess pressure from said canister to maintain a Delta pressure across said plurality of canisters for continuously delivering said liquid along said liquid flow path.

7. A method for automatically maintaining a pressure differential for the continuous delivery of a liquid to semiconductor manufacturing equipment comprising:
   providing a refillable bulk liquid delivery system having a plurality of canisters residing along a liquid flow path, the refillable bulk delivery system including a central supply canister supplying said liquid to at least one bulk supply canister, which in turn, supplies said liquid to at least one process canister;
   detecting an over pressure within at least one of said canisters;
   exhausting said over pressure by removing excess pressure from said canister to maintain a Delta pressure across said plurality of canisters for continuously delivering said liquid along said liquid flow path; and
   an automatic venting circuit at least in communication with said canister having said over pressure, said automatic venting circuit detecting said over pressure and exhausting said over pressure for maintaining said Delta pressure, said automatic venting circuit is positioned on a gas source inlet side of its corresponding said canister, and comprises a switch gauge, a vacuum relay and a time delay relay.

8. The method of claim 7 wherein said method further includes the steps of:
   activating said switch gauge upon detection of said over pressure, which in turn, activates said vacuum relay and said time delay relay;
   opening a vacuum via a signal sent from said vacuum relay;
   opening a gas source valve to a venting position in communication with an exhaust via another signal from said time delay relay; retrieving excess pressure from said canister having said over pressure using said vacuum; and
   removing said excess pressure through said gas source venting valve to said exhaust for regulating said pressure within said canister back to a desired pressure that maintains said Delta pressure.

9. The method of claim 8 further including deactivating said switch gauge upon said Delta pressure, and continuously monitoring and maintaining said Delta pressure using said automatic venting circuit.

10. The method of claim 7 wherein a programmable logic controller detects said over pressure and exhausts said over pressure for maintaining said Delta pressure.

11. The method of claim 10 further including determining if said Delta pressure is maintained across said plurality of canisters; and if not, determining if said over pressure exists within at least one of said canisters.

12. A method for automatically maintaining a pressure differential for the continuous delivery of a liquid to semiconductor manufacturing equipment comprising:
   providing a refillable bulk liquid delivery system having a plurality of canisters residing along a liquid flow path;

detecting an over pressure within at least one of said canisters using a programmable logic controller;

identifying said canister having said over pressure;

opening a vacuum source connected to said canister;

opening a gas source valve to a venting position that is in communication with an exhaust;

retrieving excess pressure from said canister having said over pressure using said vacuum;

exhausting said over pressure by removing said excess pressure from said canister through said gas source venting valve to said exhaust for regulating said pressure within said canister back to a desired pressure that maintains a Delta pressure across said plurality of canisters for continuously delivering said liquid along said liquid flow path, said programmable logic controller being implemented in exhausting said over pressure for maintaining said Delta pressure; and determining if said Delta pressure is maintained across said plurality of canisters; and if not, determining if said over pressure exists within at least one of said canisters.

13. The method of claim 12 wherein if it has been determined that said Delta pressure is not maintained, said method further including the steps of:

determining if an under pressure exists within any of said canisters;

identifying any said canisters having said under pressure;

opening a line from a gas source to said canisters having said under pressure;

providing gas into said canisters having said under pressure until an ideal canister pressure has been obtained for maintaining said Delta pressure.

14. The method of claim 13 further including the step of continuously monitoring and regulating both over pressures and under pressures within said refillable bulk liquid delivery system for maintaining said Delta pressure across said plurality of canisters to continuously delivering said liquid to said semiconductor manufacturing equipment.

* * * * *